United States Patent [19]

van den Berg

[11] Patent Number: 5,686,838
[45] Date of Patent: Nov. 11, 1997

[54] MAGNETORESISTIVE SENSOR HAVING AT LEAST A LAYER SYSTEM AND A PLURALITY OF MEASURING CONTACTS DISPOSED THEREON, AND A METHOD OF PRODUCING THE SENSOR

[75] Inventor: Hugo van den Berg, Bundesrepublik, Germany

[73] Assignee: Siemens Aktiengesellschaft, München, Germany

[21] Appl. No.: 454,340

[22] PCT Filed: Dec. 16, 1993

[86] PCT No.: PCT/DE93/01204

§ 371 Date: Jun. 19, 1995

§ 102(e) Date: Jun. 19, 1995

[87] PCT Pub. No.: WO94/15223

PCT Pub. Date: Jul. 7, 1994

[30] Foreign Application Priority Data

Dec. 21, 1992 [DE] Germany ............... 42 43 358.4

[51] Int. Cl.⁶ ............... G01R 33/06; H01L 43/08
[52] U.S. Cl. ............... 324/252; 324/207.21; 360/113
[58] Field of Search ............... 324/207.21, 252; 338/32 R, 32 H; 360/113, 126

[56] References Cited

U.S. PATENT DOCUMENTS

| 5,014,147 | 5/1991 | Parkin et al. | 360/113 |
|---|---|---|---|
| 5,287,238 | 2/1994 | Baumgart et al. | 324/252 |
| 5,296,987 | 3/1994 | Anthony et al. | 324/252 |
| 5,408,377 | 4/1995 | Gurney et al. | 324/252 |
| 5,462,795 | 10/1995 | Shinjo et al. | 324/252 |

FOREIGN PATENT DOCUMENTS

| 0 346 817 | 12/1989 | European Pat. Off. . |
|---|---|---|
| 0 432 890 | 6/1991 | European Pat. Off. . |
| 0 498 668 | 8/1992 | European Pat. Off. . |
| 00550306 | 7/1993 | European Pat. Off. . |

OTHER PUBLICATIONS

Physical Review B, Condensed Matter, vol. 44, No. 10, 1 Sep. 1991, New York, US, pp. 5358–5361, V.S. Speriosu et al.: *Nonoscillatory Magnetoresistance in Co/Cu/Co Layered Structures with Oscillatory Coupling.*

Physical Review Letters, vol. 61, No. 21, 21 Nov. 1988, pp. 2472–2475, M.N. Baibich et al.: *Giant Magnetoresistance of (001) Fe/(001) Cr Magnetic Superlattices.*

Physical Review Letters, vol. 63, No. 6, 7 Aug. 1989,. pp. 664–667, R. E. Camley et al.: *Theory of Giant Magnetoresistance Effects in magnetic Layered Structures with Antiferromagnetic Coupling.*

Journal Of Applied Physics, vol. 70, No. 10, 15 Nov. 1991, pp. 5864–5866, P. Lubitz et al.: *The Magnetoresistance of Uncoupled FE–Cu–Co Sandwiches.*

Physical Review B, vol. 46, No. 1, 1 Jul. 1992, pp. 548–551; S.F. Lee et al.: *Field–Dependent Interface Resistance of Ag/Co Multilayers.*

(List continued on next page.)

*Primary Examiner*—Sandra L. O'shea
*Assistant Examiner*—Jay M. Patidar
*Attorney, Agent, or Firm*—Kenyon & Kenyon

[57] ABSTRACT

A magnetoresistive sensor includes at least one measuring layer having a magnetization $\overline{M}_M$ in the plane of the layer, and a bias layer having a fixed magnetization $\overline{M}_B$ in the plane of the layer, which are exchange-decoupled from one another by an interlayer. To achieve magnetostatic decoupling of the measuring layer and the bias layer coupled anti-ferromagnetically in an "artificial anti-ferromagnet" to a magnetic layer through a coupling layer. In a preferred embodiment, the magnetizations of the measuring layer $\overline{M}_M$ and of the bias layer $\overline{M}_B$ are at least approximately orthogonal to each other. The resulting sensor has a linear characteristic and maximum sensitivity.

22 Claims, 3 Drawing Sheets

OTHER PUBLICATIONS

J. Appl. Phys., vol. 67, No. 9, 1 May 1990, pp. 5680–5682; C. Dupas et al.: *Very Large Magnetoresistance Effects Induced by Antiparallel Magnetization in two Ultrathin Cobalt Films*.

Journal of Magnetism and Magnetic Materials, vol. 94, 1991, L1–L5, Elsevier Science Publishers B.V., North Holland, D.H. Mosca et al.: *Oscillatory Interlayer Coupling and Giant Magnetoresistance in Co/Cu Multilayers*.

Journal of Magnetism and Magnetic Materials, vol. 93, 1991, pp. 101–104, Elsevier Science Publishers B.V., North Holland, B. Dieny et al.: *Spin–Valve Effect in Soft Ferromagnetic Sandwiches*.

MAGNETORESISTIVE SENSOR HAVING AT LEAST A LAYER SYSTEM AND A PLURALITY OF MEASURING CONTACTS DISPOSED THEREON, AND A METHOD OF PRODUCING THE SENSOR

BACKGROUND OF THE INVENTION

The invention relates to a magnetoresistive sensor and a method for fabricating it.

In ferromagnetic transition metals such as nickel (Ni), iron (Fe) or cobalt (Co) and in alloys containing these metals, the electrical resistance depends on the magnitude and direction of a magnetic field permeating the material. This effect is referred to as anisotropic magnetoresistance (AMR) or anisotropic magnetoresistive effect. Physically, it is based on the different scattering cross sections of electrons having different spins which are referred to as majority electrons and minority electrons of the D band. A thin layer made of a magnetoresistive material having a magnetization in the plane of the layer is generally used for magnetoresistive sensors. The change in resistance as the orientation of an applied magnetic field rotates with respect to the direction of the current may amount to several percent of the normal isotropic resistance.

Multilayer systems are known which comprise a plurality of ferromagnetic layers which are arranged in a stack and are separated from one another by metallic interlayers, and whose magnetizations in each case coincide in orientation with the plane of the layer. The respective layer thicknesses in this arrangement are chosen to be considerably smaller than the mean free path of the conduction electrons. Each layer displays not only the anisotropic magnetoresistive effect described above, but also the so-called giant magnetoresistive effect or giant magnetoresistance (Giant MR). Giant MR arises due to the differential scattering of majority and minority conduction electrons in the bulk of the layers, especially in alloys, and at the interfaces between the ferromagnetic layers and the interlayers. This Giant MR is an isotropic effect and may be considerably larger than the anisotropic MR, with values of up to 70% of the normal isotropic resistance.

Two basic types of such Giant-MR multilayer systems are known. In the first type, the ferromagnetic layers are anti-ferromagnetically coupled to one another via the interlayers, so that the magnetizations of two adjacent ferromagnetic layers (which coincide with the planes of the layers) align themselves antiparallel with respect to one another in the absence of an external magnetic field. An example of this type are iron-chromium superlattices (Fe-Cr superlattices) having ferromagnetic layers consisting of Fe and anti-ferromagnetic interlayers consisting of Cr. An applied external magnetic field causes the magnetizations of adjacent ferromagnetic layers to rotate against the anti-ferromagnetic coupling forces and to align themselves in parallel. This reorientation of the magnetizations by the magnetic field results in a steady decrease of the Giant MR. The magnitude of this decrease corresponds to the magnitude of the external applied magnetic field. Once a saturation field strength $H_s$ is reached, no further change in the Giant MR takes place, because all magnetizations are then aligned in parallel with respect to one another. The Giant MR in this situation depends solely on the magnitude of the field strength ("Physical Review Letters", Vol. 61, No. 21, Nov. 21, 1988, pages 2472–2475).

This type of system comprising anti-ferromagnetically coupled ferromagnetic layers has also been the subject of theoretical calculations which show that the current coefficients and the transmission coefficients for spin-up and spin-down electrons scattered at the interfaces depend on the angle between the magnetizations in adjacent ferromagnetic layers. According to these calculations, the Giant MR increases steadily as the angle between the two magnetizations increases from 0° to 180°, and is greatest at an angle of 180° ("Physical Review Letters", Vol. 63, No. 6, August 1989, pages 664 to 667).

In the second type of a Giant-MR multilayer system, ferromagnetic layers whose magnetizations in the planes of the layers are, on average, parallel to one another, are separated from one another by diamagnetic or paramagnetic interlayers consisting of metal. The thickness of the interlayers is chosen to be sufficiently large for the magnetic exchange coupling between the magnetizations of the ferromagnetic layers to be as small as possible. In each case, adjacent ferromagnetic layers have different coercive field strengths. As a result, the mean values (initially parallel in saturation) of the magnetizations M1 and M2 of the magnetically softer measuring layers and the adjacent magnetically harder bias layers, respectively, are rotated differentially by a magnetic field H. An angle Phi between the mean values of the magnetizations M1 and M2 is established which depends on the magnetic field H. The dependence of the individual magnetizations M1 and M2 on the magnetic field H in the process results from the corresponding hysteresis curves of both the magnetically softer and the magnetically harder material. Between the coercive field strengths $H_{c1}$ of the magnetically soft and $H_{c2}$ of the magnetically hard layers, and between $-H_{c2}$ and $-H_{c1}$ there is in each case a region in which the magnetization M1 is already saturated and the magnetization M2 still has its value corresponding to saturation and is aligned antiparallel to the magnetization M1, i.e., Phi=180°. In this region, the MR signal is at a maximum and is constant. Different coercive field strengths $|H_{c1}| \leq |H_{c2}|$ can be set by selecting different materials, by different fabrication processes, or by selecting different thicknesses of the same material. Known layer structures comprising different materials are, for example, NiFe-Cu-Co layer structures and Fe-Cu-Co structures. A known layer system based on different fabrication or different thicknesses is a Co-Au-Co system ("Journal of Applied Physics", Vol. 70, No. 10, Nov. 15, 1991, pages 5864–5866). The MR signal of these known layer systems then, however, depends on its previous history, i.e., along which path and between which values for the magnetic field and in which direction the hysteresis curves are traversed. It is therefore not possible to implement an MR sensor having an unambiguous characteristic curve using these systems. Moreover, in these known layer systems, part of the magnetic flux of the harder bias layers forms a circuit above the softer measuring layers. The resulting magnetic interference field reduces the measuring sensitivity of the sensor and results in an undesirable shift of the sensor characteristic curve.

It is therefore an object of the present invention to devise a magnetoresistive sensor layer system that has at least one measuring layer and at least one bias layer. The bias layer is exchange-decoupled from the measuring layer by an interlayer so that the sensor has an unambiguous characteristic curve. Any interference fields of the bias layer are largely suppressed in the measuring layer. The present invention also includes a method for fabricating such magnetoresistive sensors, and in particular linear magenetoresistive sensors.

SUMMARY OF THE INVENTION

The present invention provides a magnetoresistive sensor comprising a multi-layer system, and a method of fabricating the sensor. The sensor has at least one measuring layer having a magnetization $\overline{M}_M$ oriented in the plane of the layer. This magnetization assumes a predefined ground state $\overline{M}_{MD}$ in the absence of an external applied magnetic field. When such an external field is applied, the magentization of the measuring layer reversibly depends upon the intensity and direction of the external field. The sensor also has a bias layer disposed on one side of the measuring layer with an interlayer between the bias layer and measuring layer. The bias layer has a magnetization $\overline{M}_B$ in the plane of the bias layer that is at least approximately constant in the measuring range of the external applied magnetic field, and at least approximately magnetically exchange-decoupled from the measuring layer by the interlayer. A coupling layer is disposed on the side of the bias layers facing away from the measuring layer. A magnetic layer is then disposed on the coupling layer on the side of the coupling layer facing away from the bias layer. The coupling layer anti-ferromagnetically couples the magnetic layer to the bias layer.

The magnetization $\overline{M}_M$ of the measuring layer depends, at least in one direction, reversibly and therefore unambiguously on the magnetic field to be measured, and the bias layer is provided with a magnetization $\overline{M}_B$ which is at least approximately constant in the measuring range. As a result, a resistance signal is obtained which depends unambiguously on the magnetic field. In order to prevent part of the magnetic flux of the bias layer, especially at a large $\overline{M}_B$, from forming a circuit above the measuring layer, the bias layer is coupled anti-ferromagnetically, at its side facing away from the measuring layer, to a magnetic layer via a coupling layer. The bias layer, the coupling layer and the magnetic layer form an "artificial anti-ferromagnet" which to the outside is magnetically largely neutral, ie. virtually all of its magnetic flux forms a circuit between the bias layer and the magnetic layer. A particular advantage of this "artificial anti-ferromagnet" is the stabilization of the magnetization $\overline{M}_B$ of the bias layer, even in the case of strong external magnetic fields H. For the purpose of measuring the resistance of the layer system, at least two measuring contacts are provided.

These measuring contacts may be arranged at a distance from one another, preferably of the uppermost layer, so that the test current on average flows parallel to the planes of the layers (cip=current-in-planes). In another embodiment, the measuring contacts are arranged on the uppermost and the lowermost layer so that the test current flows perpendicular to the planes of the layers (cpp=current-perpendicular-to-planes). A layer system having cpp measuring contacts thus arranged is known from "Physical Review B", Vol. 46, No. 1 (1992), pages 548–551.

In a preferred embodiment with symmetrical construction there is arranged, on the other side of the magnetic layer, a further bias layer which is coupled anti-ferromagnetically to the magnetic layer via a coupling layer.

Preferably, the measuring layer is provided with a magnetic preferred axis $A_M$. Alternatively, though, the measuring layer may also be selected from a superparamagnetic material. In that case its magnetization $\overline{M}_M$ in all directions depends reversibly on the magnetic field.

In the ground state, ie. if no magnetic field is applied, a ground state magnetization $\overline{M}_{MO}$ of the measuring layer is established. This ground state magnetization $\overline{M}_{MO}$ of the measuring layer then, in one embodiment, is aligned parallel to the magnetization or the magnetizations $\overline{M}_B$ of the bias layer or bias layers. To this end, the measuring layer is magnetized in line with a preferred axis aligned parallel with the magnetization $\overline{M}_B$.

In a particularly advantageous embodiment, the ground state magnetization $\overline{M}_{MO}$ of the measuring layer and the fixed magnetization $\overline{M}_{MB}$ of the bias layer are aligned at least approximately perpendicular to each other. As a result, the working point of the sensor, if no magnetic field is present, H=0, is set in a range in which the characteristic curve is at least approximately linear and has a maximum ascent.

In order to align the magnetizations $\overline{M}_{MO}$ and $\overline{M}_B$ at least approximately perpendicular to one another, the measuring layer is preferably provided with a magnetic preferred axis $A_M$ which is aligned at least approximately perpendicular to the fixed magnetization $\overline{M}_B$ of the bias layer, and is magnetized along this preferred axis $A_M$.

In another preferred embodiment, use is made of the so-called 90° coupling. The thickness of the interlayer is set to a value at which the magnetic exchange coupling between measuring layer and bias layer changes in sign, i.e., switches over from a ferromagnetic coupling to an anti-ferromagnetic coupling or vice versa. Owing to the random fluctuations of the thickness, the ground state magnetization $\overline{M}_{MO}$ of the measuring layer on average is established automatically at an angle of 90° with respect to the magnetization $\overline{M}_B$ of the bias layer.

In the case of various materials and various geometries of the layers it may be necessary, in order to compensate for the arising demagnetizing fields, for the angle between $\overline{M}_{MO}$ and $\overline{M}_B$ to be set to a value slightly differing from 90° in order to achieve that working point which is optimal for linearity and sensitivity of the sensor.

Major deviations from the at least approximately perpendicular alignment of the magnetizations $\overline{M}_{MO}$ and $\overline{M}_B$ with respect to one another impair the sensitivity and linearity of the sensor.

A possible cause for such troublesome deviations of the angle between the two magnetizations $\overline{M}_{MO}$ and $\overline{M}_B$ from the desired approximate 90° may reside in a residual magnetic flux of the bias layer still forming a circuit above the measuring layer. The ground state magnetization $\overline{M}_{MO}$ in the measuring layer is then, in the most adverse case of this magnetostatic coupling of measuring layer and bias layer, aligned antiparallel to the magnetization $\overline{M}_B$ in the biasing layer even if no magnetic field is applied.

In a preferred embodiment, the measuring layer, for the purpose of additional magnetostatic decoupling from the bias layer, is shorter, at least in the direction of the magnetization $\overline{M}_B$ of the bias layer and preferably all around on the outside, than at least the bias layer. Preferably, the transitions between the border regions without measuring layer and the central measuring zone having the measuring layer are designed to be fluid in character. For example, the thickness of the measuring layer in these transition zones may increase continuously towards the center.

In another embodiment, for the purpose of further magnetostatic decoupling, the magnitude of the magnetization $|\overline{M}_B|$ of the bias layer is chosen to be smaller than that of the ground state magnetization $|\overline{M}_{MO}|$ of the measuring layer.

Deviations from the predefined alignments for the magnetizations $\overline{M}_{MO}$ and $\overline{M}_B$ are also possible as a result of demagnetizing fields, particularly in the boundary zones of the layers and in particular in the bias layer. Therefore, in a preferred embodiment, the measuring contacts for measuring the resistance have been moved into an inner measuring zone of the layer system, in order to prevent the effect of these boundary zones on the test signal. In a particularly advantageous embodiment the layers are of elongated design, their longitudinal direction running perpendicular to the ground state magnetization $\overline{M}_{MO}$ of the measuring layer. As a result, the relative orientation of the ground state magnetization $\overline{M}_{MO}$ and the magnetization $\overline{M}_B$ with respect to one another is particularly stable. At the same time, a high sensitivity of the sensor is achieved and the shift of its characteristic curve is reduced, because the demagnetizing fields generated by the measuring layer and the bias layer are greatly attenuated and their effect counteracting the magnetic field to be measured is reduced.

For the purpose of deflecting the magnetic flux and to reduce the formation of domains it is possible, in a further embodiment, to replace at least one measuring layer by two measuring layers whose magnetizations are aligned antiparallel with respect to one another and which are separated by an interlayer. Preferably, both magnetizations are inclined in such a way with respect to the direction of the normal of the magnetization $\overline{M}_B$ of the bias layer that they enclose an angle of less than 180°. This reduces the formation of domains in the measuring layers.

In a particularly advantageous embodiment such materials are chosen for the layers of the sensor that the resistivity for that electron type which is scattered but little in the measuring layer if the magnetizations $\overline{M}_M$ and $\overline{M}_B$ in the measuring layer and bias layer are aligned parallel with respect to one another, is likewise as low as possible in the other layers, especially the magnetic layer of the artificial anti-ferromagnet and at its interfaces. Such a choice affords a very good contrast between the maximum and the minimum magnetoresistive signal. The decisive parameters set in this context are the ratios of the resistivity for the minority carriers and the resistivity for the majority carriers in the individual layers and at their interfaces. These parameters are determined by the respective host materials and impurities as the scattering centers. The parallel alignment of the magnetizations $\overline{M}_M$ and $\overline{M}_B$ may in this case remain even in the ground state or not until a magnetic field is applied parallel to $\overline{M}_B$.

The embodiments of layer subsystems described hitherto can be combined with one another and be arranged in a stack comprising a multiplicity of such subsystems. The number of these layer subsystems is generally chosen to be between 1 and 100. The base subsystem is the system measuring layer-interlayer-"artificial anti-ferromagnet", where the "artificial anti-ferromagnet" may comprise bias layer, coupling layer and magnetic layer or, in a symmetrical construction, two bias layers with a magnetic layer arranged therebetween and in each case coupled anti-ferromagnetically to the bias layers via a coupling layer. The alignments of the magnetizations MB of the bias layers are identical in all embodiments. The ground state magnetizations $\overline{M}_{MO}$ of the measuring layers are either collinear or aligned perpendicular to the magnetizations $\overline{M}_B$ of the bias layers. The subsystems are in each case separated from one another by a further interlayer.

A magnetoresistive sensor according to the invention; in particular the "artificial anti-ferromagnet", can be fabricated in various ways. One possibility is that of selecting materials having different coercive field strengths for the bias layer and the magnetic layer of the "artificial anti-ferromagnet". The two layers are saturated in a uniform biasing magnetic field which is greater than the two coercive field strengths. As the magnetic field decreases, the magnetization of the magnetically softer material then, owing to the anti-ferromagnetic exchange coupling, aligns itself antiparallel to the magnetization of the magnetically harder material.

A second possibility is that of impressing the field-induced preferred axis on the bias layer by a biasing magnetic field during the deposition of the layers in a vacuum system and subsequent magnetization of the bias layer along said preferred axis. The magnetization of the anti-ferromagnetically coupled magnetic layer is then automatically established antiparallel to the magnetization $\overline{M}_B$ of the bias layer. Conversely, though, the magnetic layer may be provided with a preferred axis and be magnetized along said preferred axis.

A third possibility of fabricating the artificial anti-ferromagnet is provided by selecting two magnetic materials having different Curie temperatures and at least approximately equal magnetization at room temperature or generally the operating temperature of the sensor for the bias layer and the magnetic layer. The bias layer and magnetic layer, together with the coupling layer arranged therebetween, are brought to an impressing temperature at which the magnetizabilities of the two materials differ, and are saturated in a temperature-dependent biasing magnetic field whose magnitude for saturation is different from zero, at least at the impressing temperature, and which may depend, for example, in a continuous or discontinuous manner on the temperature. If the impressing temperature is above the operating temperature, the layer having the higher Curie temperature is magnetized more strongly. In the event of an impressing temperature lower than the operating temperature, generally the layer having the lower Curie temperature is magnetized more strongly. If the temperature then changes to the operating temperature, the magnetization of the more strongly magnetized layer will no longer change and the magnetization of the other layer will be aligned antiparallel as a result of the anti-ferromagnetic coupling. In general, the impressing temperature chosen is higher than the operating temperature.

The three possibilities mentioned for selecting the material properties for the "artificial anti-ferromagnet" may, of course, also be combined at will.

DETAILED DESCRIPTION

Figure 1:
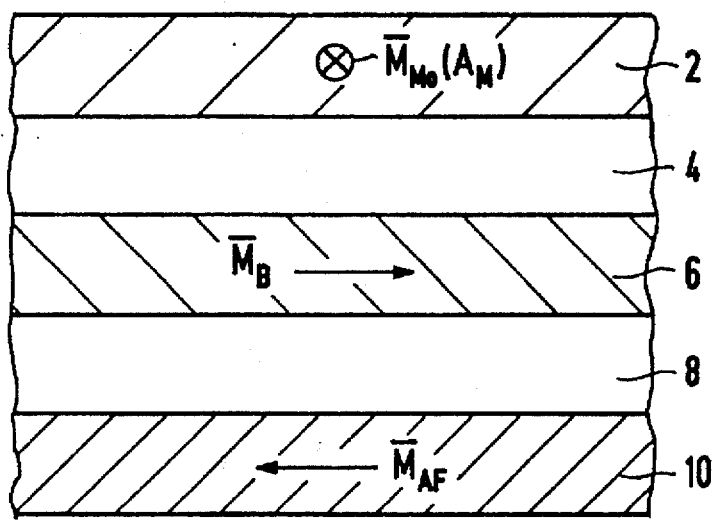
FIG. 1 schematically depicts a first embodiment of a magnetoresistive sensor according to the invention in a cross-sectional view.

FIG. 1 shows an embodiment of a magnetoresistive sensor comprising a layer subsystem which is formed from a magnetic measuring layer 2 and a magnetic bias layer 6, a non-magnetic interlayer 4 arranged therebetween and a magnetic layer 10 which is coupled anti-ferromagnetically, via a coupling layer 8, to that side of the bias layer 6 which faces away from the measuring layer 2. All layers consist of an electrically conductive material, and their thicknesses are considerably smaller than the mean free path of the conducting electrons. The measuring layer 2 has a ground state magnetization $\overline{M}_{MO}$ along a preferred axis, which is indicated by $A_M$ and runs in the plane of the layer of measuring layer 2. The bias layer 6 is provided with a fixed magnetization $\overline{M}_B$ in the plane of the layer, which is aligned at least approximately perpendicular to the preferred axis $A_M$ of the measuring layer 2 and is shown in the plane of projection. The magnetization $\overline{M}_B$ may, however, alternately have the opposite direction. Owing to the at least approximately orthogonal alignment of the preferred axis $A_M$ and thus of the ground state magnetization $\overline{M}_{MO}$ relative to the magnetization $\overline{M}_B$, the working point of the sensor in this preferred embodiment is located in an at least approximately linear region of the characteristic curve which at the same time has the greatest ascent. For the purpose of compensating for demagnetizing fields, the angle between the two magnetizations $\overline{M}_{MO}$ and $\overline{M}_B$ may deviate slightly from 90°.

Because of the anti-ferromagnetic coupling, the magnetization $A_F$ of the magnetic layer 10 is aligned antiparallel to the magnetization $\overline{M}_B$ of the bias layer 6. The bias layer 6, the coupling layer 8 and the magnetic layer 10 together form an "artificial anti-ferromagnet", which is largely magnetically neutral to the outside, because the magnetic flux essentially runs only between the bias layer 6 and the magnetic layer 10. The direction of the magnetization $\overline{M}_B$ of the bias layer 6 is therefore very stable, even in the presence of high intensity externally applied magnetic fields.

If a magnetic field, not shown in FIG. 1, is applied in the plane of the layer, the magnetization $\overline{M}_M$ in the measuring layer 2 changes from the ground state magnetization $\overline{M}_{MO}$, and the magnetization $\overline{M}_B$ of the bias layer 6 remains essentially unchanged. A component $H_v$ of the magnetic field perpendicular to the preferred axis $A_M$ of the measuring layer 2 rotates the magnetization $\overline{M}_M$ of the measuring layer 2 in the direction towards the magnetization $\overline{M}_B$ or $-\overline{M}_B$, in accordance with the field direction. At saturation, the two magnetizations $\overline{M}_M$ and $\overline{M}_B$ are then aligned parallel or antiparallel. This rotation process generates a Giant Magnetoresistive signal as a function of the angle of rotation. A component $\overline{H}_p$ of the magnetic field parallel to the preferred axis $A_M$, in contrast, causes a domain wall shift and thus merely a change in direction of the magnetization $\overline{M}_M$ at the domain walls. This does not cause a magnetoresistive signal to be generated. In the case of a magnetic field perpendicular to the plane of the layer, given the high demagnetizing fields in the measuring layer 2, likewise virtually no rotation processes take place and consequently no magnetoresistive signal is measured. The magnetoresistive sensor is therefore essentially sensitive only to that component $H_v$ of the magnetic field, which is aligned orthogonally to the preferred axis $A_M$ in this embodiment or generally to the ground state magnetization $\overline{M}_{MO}$ of the measuring layer 2.

The magnetization $\overline{M}_B$ of the bias layer 6 is to remain constant in the measuring zone of the applied field H and, in particular, is not to rotate in the plane of the layer. To this end, in one embodiment, the at least one bias layer may be impressed with a magnetic, uniaxial anisotropy, preferably a crystal anisotropy, a field-induced anisotropy, or a voltage-induced anisotropy. The bias layer is then magnetized along the anisotropy axis.

Figure 2:
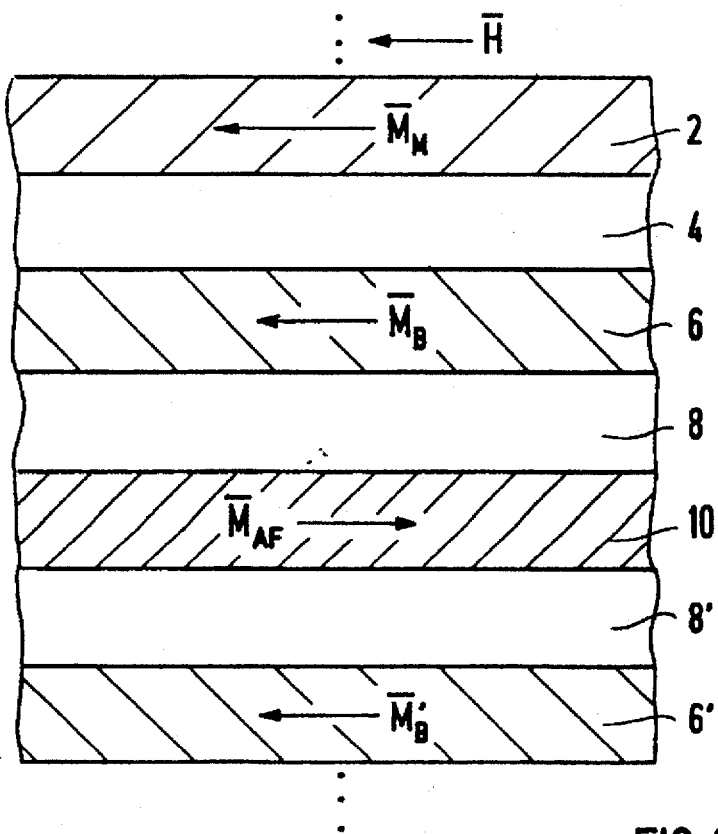
FIG. 2 schematically depicts a second embodiment of a magnetoresistive sensor according to the invention in a cross-sectional view.

In an embodiment according to FIG. 2, an "artificial anti-ferromagnet" of symmetric construction is shown. The magnetic layer 10 is again anti-ferromagnetically coupled to the bias layer 6 via the coupling layer 8. On the other side of the magnetic layer 10 a further coupling layer 8' and thereon a further bias layer 6' are disposed. The bias layer 6' and the magnetic layer 10 are likewise coupled anti-ferromagnetically, so that the magnetizations $\overline{M}_B$ and $\overline{M}_B'$ of the two bias layers 6 and 6' are aligned parallel to one another and are both aligned antiparallel to the magnetization $A_F$ of the magnetic layer 10. Disposed on the bias layer 6 there is again the interlayer 4 and thereon the measuring layer 2. The bias layer 6' may likewise be followed by a further interlayer and further measuring layer. In the embodiment shown, the magnetization $\overline{M}_M$ of the measuring layer 2 is aligned parallel to the magnetizations $\overline{M}_B$ and $\overline{M}_B'$ of the bias layers 6 and 6'. The magnetization $\overline{M}_M$ may have been rotated into this orientation from the ground state magnetization $\overline{M}_{MO}$ orthogonal to $\overline{M}_B$ by a magnetic field or alternatively, in an embodiment not shown, may have been preset in the ground state, for example by impressing a corresponding preferred axis. For the purpose of measuring the resistance, two measuring contacts are disposed (not shown), preferably on the uppermost layer of the layer system, at a distance from each other which is preferably considerably greater than the thickness of the layer system (cip). In another embodiment (not shown), the measuring contacts are disposed on the upper side and the underside of the layer system (cpp). Their distance apart then corresponds to the thickness of the layer system. The typical thickness of the layer system as a whole is preferably between 3 nm and 400 nm, and the typical distance between the measuring contacts is preferably in the range from 3 nm to 1 mm. Between the two measuring contacts (not shown in FIG. 2), an electrical current of conduction electrons is formed in the entire layer system. This current can be superposed from two non-interacting component currents which are composed of electrons of different spins. In the magnetized layers there is then a component current of majority electrons whose spins on average are aligned in parallel with the magnetization of the corresponding layer, and a component current of minority carriers whose spins are, on average, aligned antiparallel to the magnetization. In magnetic transition metals which are preferably used as materials for these layers, the scattering cross sections of the scattering centers formed from impurities are of different magnitude for electrons having different spins. Such scattering centers are situated both within the magnetic layers and at their interfaces. The scattering of the electrons in the nonmagnetic interlayers and the coupling layers in contrast is spin-independent. Thus both the magnetic layers and the interfaces to these layers have different resistivities RHOMAJ and RHOMIN for majority electrons and minority electrons, respectively. The ratio ALPHA=RHOMIN/RHOMAJ of the resistance RHOMIN for the minority carriers to the resistance RHOMAJ for the majority carriers depends on the host material and the defects.

To obtain as large a difference as possible between minimum and maximum Giant Magnetoresistive signal, materials are selected for the individual layers such that the electrons having the lower resistance in the measuring layer 2 (if the magnetizations $\overline{M}_M$ and $\overline{M}_B$ of the measuring layer 2 and bias layer 6 are aligned parallel to one another) are equally scattered to a lesser extent in all the other magnetic layers and at all of the interfaces between the layers. This is achieved by host materials and defects for the layers having magnetizations parallel to the measuring layer 2 and for their interfaces such that each of the ALPHA parameters for these layers are either larger or smaller than one. In the embodiment shown in FIG. 2, this means that the ALPHA parameters for the measuring layer 2, its interface to the interlayer 4, for the bias layer 6 and its two interfaces to the interlayer 4 and the coupling layer 8, and for the bias layer 6' and its interface to the coupling layer 8' are each set to be larger or smaller than one.

In the magnetic layer 10 the magnetization $A_F$ is then aligned antiparallel to the magnetizations $\overline{M}_M$, $\overline{M}_B$ and $\overline{M}_B{}'$ of the other magnetized layers. Electrons which are majority carriers in the measuring layer 2 and the bias layers 6 and 6' therefore become minority carriers in the magnetic layer 10 and vice versa. Therefore, the parameters ALPHA for the magnetic layer 10 and its two interfaces to the coupling layers 8 and 8' are chosen to be greater than one if the ALPHAs of the other magnetized layers and their interfaces are smaller than one and smaller than one if the other ALPHAs are greater than one. Preferably, the ALPHAs of the measuring layer 2 and the bias layers 6 and 6' and their interfaces are chosen to be greater than one, and those of the magnetic layer 10 and its interfaces are chosen to be smaller than one. In that case, the main contribution to the current between the measuring contacts comes from the component current of the majority carriers if the magnetization $\overline{M}_M$ is parallel to $\overline{M}_B$.

If an external magnetic field then rotates the magnetization $\overline{M}_M$ the measuring layer 2 into an orientation which is antiparallel to the magnetization $\overline{M}_B$ of the bias layer 6, the previous majority electrons in the measuring layer 2 become minority electrons in the bias layers 6 and are therefore strongly scattered in the entire layer system. Consequently, the giant-resistance signal rises to its maximum value.

Figure 3:
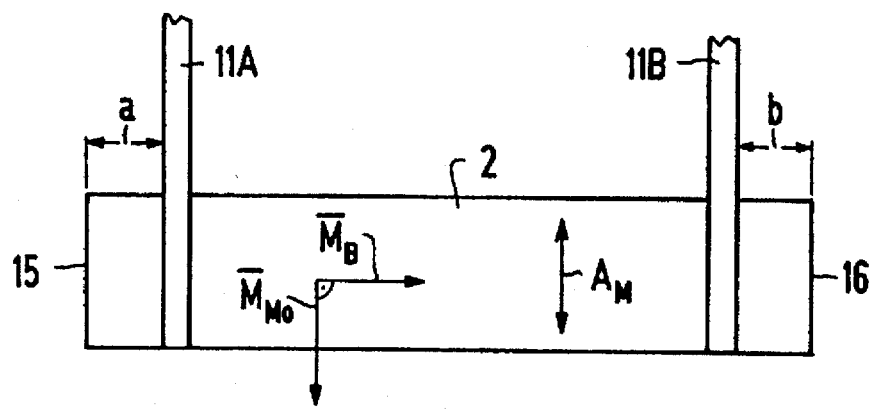
FIG. 3 schematically depicts an embodiment of the present invention having measuring contacts moved inwards in a plan view.

In a preferred embodiment according to FIG. 3, the layers are constructed as elongated strips whose longitudinal direction runs perpendicular to the ground state magnetization $\overline{M}_{MO}$ of the measuring layer 2 and thus also parallel to the magnetization $\overline{M}_B$ of the bias layer 6. As a result of this sizing, the demagnetizing fields directed counter to the measuring field are distinctly attenuated and the sensitivity of the sensor is thus increased. Any shift of the measuring characteristic curve is avoided. However, demagnetizing fields still occur which falsify a measurement in the vicinity of the ends 15 and 16 of the measuring layer 2. Consequently, two measuring contacts 11A and 11B that are provided for the measurement of the resistance are moved inwards in the longitudinal direction by a distance a and b, respectively, as shown in FIG. 3. Preferably, the two distances a and b are of equal size. The measuring contacts 11A and 11B are preferably positioned on the measuring layer 2, but may alternatively be positioned on a bias layer or an interlayer.

In an embodiment (not shown) comprising cpp measuring contacts as described above, the measuring contacts may likewise have been moved into an inner measuring zone.

Figure 4:
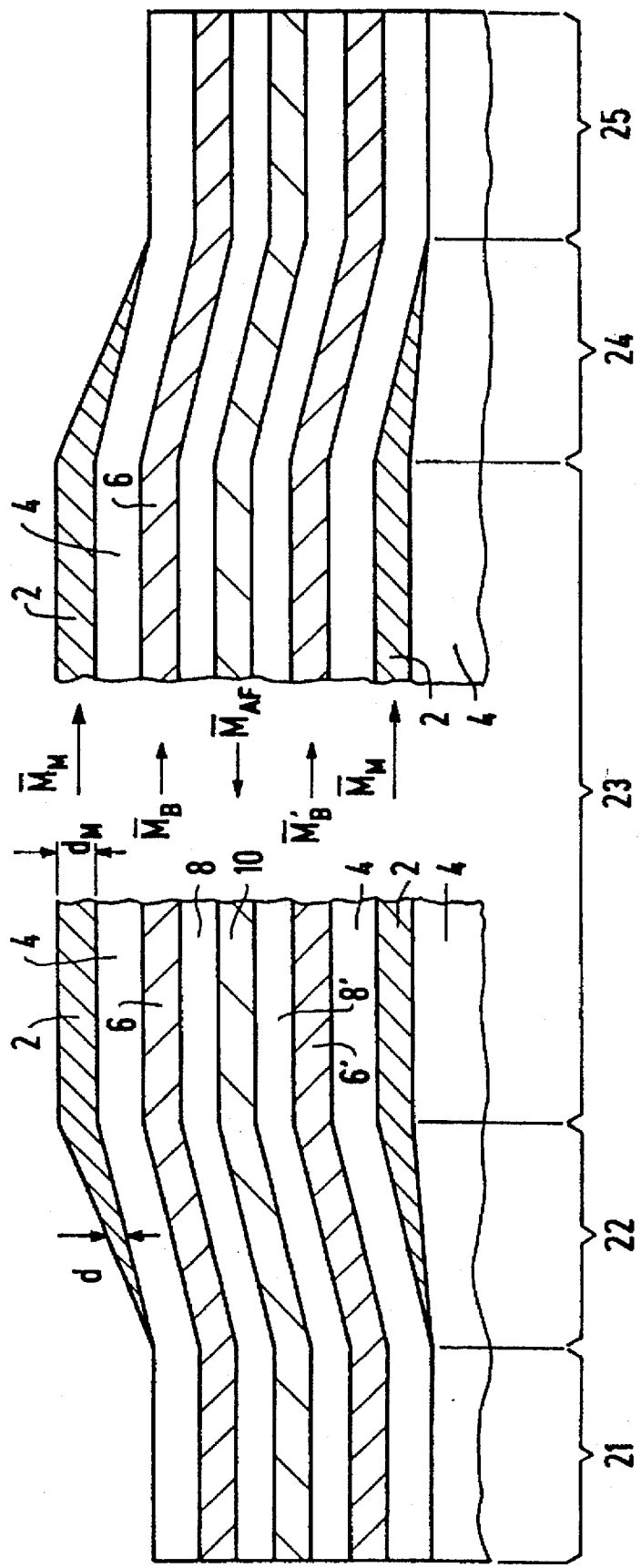
FIG. 4 schematically depicts an embodiment of the present invention having boundary zones without a measuring layer in a cross-sectional view.

To further suppress the magnetic flux of the bias layers 6 above the measuring layers 2, a preferred embodiment according to FIG. 4 provides for two boundary zones 21 and 25 in which no measuring layer 2 is present, and for a central measuring zone 23 having measuring layers 2. This shortening of the measuring layers 2 is effected at least in the direction parallel to the magnetization $\overline{M}_B$ of the bias layer 6 and preferably in all directions, so that the bias layers 6 project all around beyond the measuring layers. The interlayers 4 are preferably as long as the bias layers 6. The "artificial anti-ferromagnet" in the embodiment depicted comprises two bias layers 6 and 6' and a central magnetic layer 10 having a magnetization $A_F$ which is coupled anti-ferromagnetically to the bias layers 6 and 6', respectively, via one coupling layer 8 or 8' in each case. In the measuring zone 23 there is disposed, on each bias layer 6 and 6', an interlayer 4 and thereon a measuring layer 2. Of course, again a plurality of subsystems may be provided in accordance with the embodiments depicted in FIG. 1 or 2. The magnetizations $\overline{M}_M$ of the measuring layers 2 are aligned parallel to the magnetizations $\overline{M}_B$, preferably by means of an external saturating magnetic field (not shown).

Between the boundary zones 21 and 25 and the measuring zone 23 a transition zone 22 and 24, respectively, is provided in each case, in which the thickness of the measuring layers 2 increases continuously inwards from the outside. Whereas the bias layers 6 and the interlayers 4 have at least approximately the same thickness in the transition zones 22 and 24 as in the boundary zones 21 and 25 and in the measuring zone 23, the thicknesses d of the measuring layers 2 increase linearly in the transition zones 22 and 24 under a specific flare angle from d=0 in the boundary zones 21 and 25 up to a constant value d=dM in the measuring zone 23.

In another embodiment (not shown), the boundary zones 21 and 25 and the measuring zone 23 may in each case have a step between them, whose height corresponds to the total thickness of the measuring layers 2 missing in the boundary zones 21 and 25.

Figure 5:
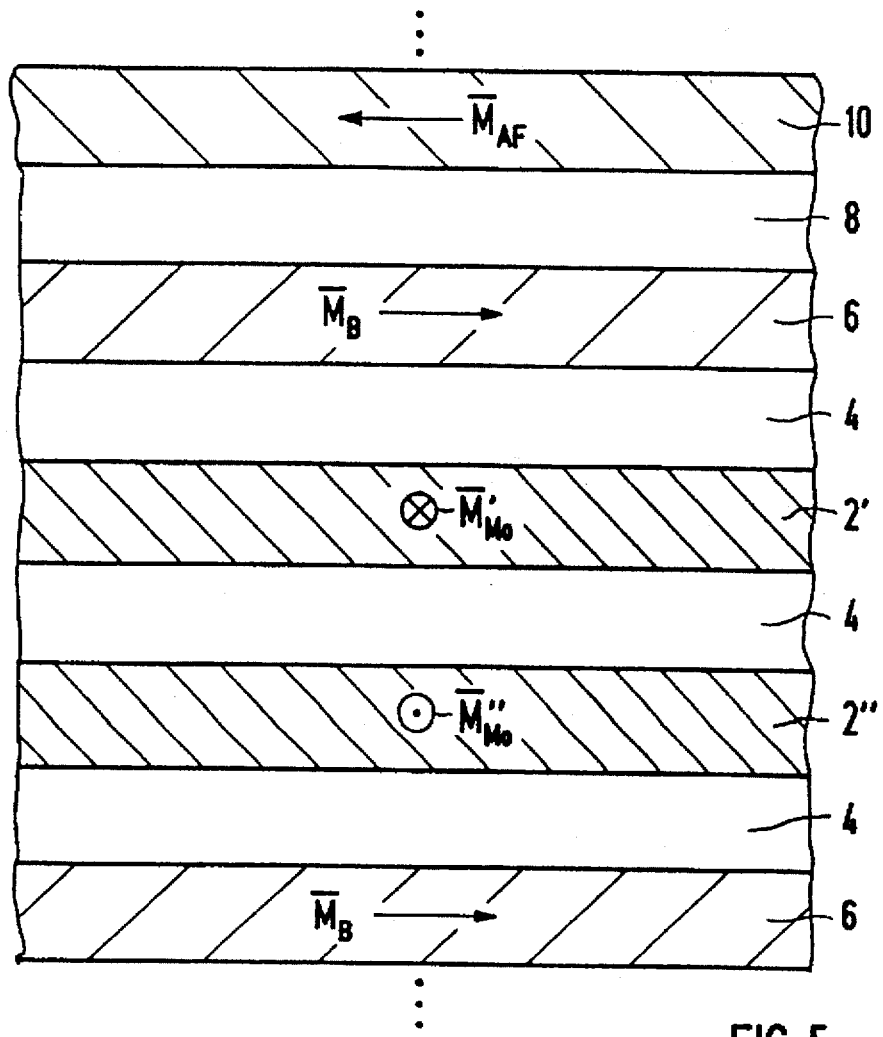
FIG. 5 schematically depicts an embodiment of the present invention having two adjacent measuring layers in a cross-sectional view.

In an embodiment in accordance with FIG. 5, at least one measuring layer 6 has been replaced by two measuring layers 2' and 2". The ground state magnetizations $\overline{M}_{MO}{}'$ and $\overline{M}_{MO}{}''$ of these two measuring layers 2' and 2" are now aligned antiparallel with respect to one another, preferably by impressing appropriate preferred axes, and are preferably of equal magnitude, ie. $\overline{M}_{MO}{}'=-\overline{M}_{MO}{}''$. Subsequently, the magnetic flux of the measuring layers 2' and 2" remains essentially confined to the measuring layers 2' and 2" and does not encroach on the adjacent bias layers 6. The bias layers 6 are in each case provided with equidirectional magnetizations $M_B$ which are aligned at least approximately perpendicular to the ground state magnetizations $\overline{M}_{MO}{}'$ and $\overline{M}_{MO}{}''$ of the measuring layers 2' and 2", respectively.

Because of fluctuations in the directions of the preferred axes and an ambiguous sense of rotation resulting therefrom for the magnetizations $\overline{M}_M{}'$ and $\overline{M}_M{}''$ from the ground state magnetizations $\overline{M}_{MO}{}'$ and $\overline{M}_{MO}{}''$, respectively, domains are generally formed in the measuring layers 2' and 2" after saturation at smaller field values. In a particular embodiment (not shown), this domain formation is avoided by setting the ground state magnetizations $\overline{M}_{MO}{}'$ and $\overline{M}_{MO}{}''$ of the two measuring layers 2' and 2" respectively, at a small angle with respect to the direction perpendicular to the magnetization $\overline{M}_B$ of the bias layers 6. This small angle is set so that $\overline{M}_{MD}{}'$ and $\overline{M}_{MD}{}''$ are no longer exactly anti-parallel to each other, but rather enclose an angle of slightly less than 180°. This can be achieved by impressing on the corresponding measuring layers 2' and 2" preferred axes which are suitably inclined with respect to one another. As a result, for each of the two magnetizations $\overline{M}_M{}'$ and $\overline{M}_M{}''$ an unambiguous sense of rotation is predefined from the saturation when an external magnetic field is applied.

The magnetic materials provided for the measuring layers may be, for example, Co, Fe, Ni, SmCo or TbFeCo, and for the bias layers Ni80Fe20 or Ni66CoFe can be used. The interlayers preferably comprise Cu, Au, Ag or Cr.

I claim:

1. A magnetoresistive sensor comprising:
   a) a layer system, wherein said layer system includes:
      a1) at least one measuring layer which, in the plane of said measuring layer, has a magnetization which at least in one direction depends reversibly on an applied magnetic field, and in the absence of said magnetic field, said magnetization corresponds to a predefined ground state magnetization;

a2) at least on one side of the measuring layer a bias layer having a magnetization in the plane of said bias layer, said magnetization being at least approximately constant in the measuring range of the magnetic field;

a3) an interlayer, disposed between the bias layer and the measuring layer, by which interlayer the bias layer is at least approximately magnetically exchange-decoupled from the measuring layer; and a4) a magnetic layer which is coupled anti-ferromagnetically to the bias layer through a coupling layer, said coupling layer being disposed between the bias layer and the anti-ferromagnetically coupled magnetic layer; and b) measuring contacts at the layer system to detect a resistance signal which is a measure for the applied magnetic field.

2. The magnetoresistive sensor of claim 1, with a second coupling layer disposed on the side of the magnetic layer facing away from the bias layer, and a second bias layer disposed on the side of the second coupling layer facing away from the magnetic layer, whereby the second coupling layer anti-ferromagnetically couples the second bias layer to the magnetic layer.

3. The magnetoresistive sensor of claim 2, wherein the Curie temperatures of said bias layers differ from that of said magnetic layer.

4. The magnetoresistive sensor of claim 1, wherein the Curie temperatures of said bias layer differs from that of said magnetic layer.

5. The magnetoresistive sensor of claim 1, wherein said bias layer has a coercive field strength which differs from that of said magnetic layer.

6. The magnetoresistive sensor of claim 1, wherein said bias layer is magnetized along a preferred axis.

7. The magnetoresistive sensor of claim 1, wherein the ground state magnetization of said measuring layer and the magnetization of the bias layer are aligned at least approximately perpendicular to each other.

8. The magnetoresistive sensor of claim 1, wherein the ground state magnetization of said measuring layer and the magnetization of said bias layer are aligned parallel to each other.

9. The magnetoresistive sensor of claim 1, wherein the materials for the layers are chosen in such a way that when magnetizations of the measuring layer and the bias layer are aligned in at least approximately a parallel fashion, the minority spin state for the electrons in the measuring layer is also the minority spin state for the electrons in all the other magnetic layers and at the interfaces thereof.

10. The magnetoresistive sensor of claim 1, wherein the magnitude of the magnetization of the bias layer is chosen to be smaller than that of the ground state magnetization of the measuring layer.

11. The magnetoresistive sensor of claim 1, wherein the measuring layer and the bias layer extend in a longitudinal direction that is perpendicular to the ground state magnetization of the measuring layer.

12. The magnetoresistive sensor of claim 1, wherein the measuring layer is shorter than said bias layer in at least one direction parallel to the magnetization of the bias layer.

13. The magnetoresistive sensor of claim 12, wherein the layer system further comprises an edge zone without a measuring layer disposed towards the edges of said layer system, a measuring zone with a measuring layer and a transition zone between the edge zone and a measuring zone, wherein the thickness of the measuring layer increases continuously.

14. The magnetoresistive sensor of claim 1, wherein the measuring contacts are arranged at a predetermined distance from the edges of said layer system.

15. The magnetoresistive sensor of claim 1, wherein said measuring contacts are arranged on an outer layer of said sensor.

16. The magnetoresistive sensor of claim 1, wherein said measuring layer is replaced by a first measuring layer and a second measuring layer with an interlayer disposed therebetween so that the interlayer exchange-decouples the first measuring layer from the second measuring layer.

17. The magnetoresistive sensor as claimed in claim 16, wherein the ground state magnetization of the first measuring layer and the ground state magnetization of the second measuring layer are aligned at least approximately antiparallel with respect to one another in the absence of an external applied magnetic field.

18. The magnetoresistive sensor as claimed in claim 17, characterized in that the ground state magnetization of the first measuring layer and the ground state magnetization of the second measuring layer are each inclined by at least approximately the same angle with respect to the direction perpendicular to the magnetization of the bias layer and together enclose an angle of less than 180°.

19. The magnetoresistive sensor of claim 1, wherein the measuring layer is magnetized in the direction of a preferred axis in the absence of an external applied magnetic field.

20. The magnetoresistive sensor of claim 1, wherein each magnetic layer is magnetized along a preferred axis.

21. A method for fabricating a magnetoresistive sensor having a multilayer structure including a measuring layer, a bias layer, an interlayer between said measuring layer and bias layer, a magnetic layer and a coupling layer between the bias layer and the magnetic layer, comprising the following steps:

a) selecting magnetic materials for the bias layer and the magnetic layer having different Curie temperatures and at least approximately equal magnetizations at a given operating temperature and different magnetizabilities at a magnetizing temperature that differs from the operating temperature;

b) bonding together the bias layer, the coupling layer, and the magnetic layer by:
  i) bringing the bias layer in contact with one side of the coupling layer, and bringing the magnetic layer in contact with the other side of the coupling layer;
  ii) bringing the assembly of step i) to the magnetizing temperature; and
  iii) arranging said assembly in a temperature-dependent biasing magnetic field which has a predetermined value at least at said magnetizing temperature;

c) bringing said assembly to the operating temperature.

22. A method for fabricating a magnetoresistive sensor of claim 21, comprising the following steps:

a) selecting said magnetic materials that have different coercive field strengths;

b) saturating the bias layer, the coupling layer, and the magnetic layer are in a saturation magnetic field when they are bonded together.

* * * * *